United States Patent
Guenard et al.

(10) Patent No.: US 10,001,864 B2
(45) Date of Patent: Jun. 19, 2018

(54) METHOD AND DEVICE FOR LOCATING INTERACTION ON A TOUCH-SENSITIVE SURFACE

(71) Applicant: COMMISSARIAT A L'ENERGIE ATOMIQUE ET AUX ENERGIES ALTERNATIVES, Paris (FR)

(72) Inventors: Nicolas Guenard, Chatou (FR); Christian Bolzmacher, Montrouge (FR); Moustapha Hafez, Arcueil (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 86 days.

(21) Appl. No.: 15/315,312

(22) PCT Filed: Jun. 9, 2015

(86) PCT No.: PCT/EP2015/062763
§ 371 (c)(1),
(2) Date: Nov. 30, 2016

(87) PCT Pub. No.: WO2015/189167
PCT Pub. Date: Dec. 17, 2015

(65) Prior Publication Data
US 2017/0123549 A1 May 4, 2017

(30) Foreign Application Priority Data
Jun. 11, 2014 (FR) .................................. 14 55302

(51) Int. Cl.
*G06F 3/041* (2006.01)
*G06F 1/16* (2006.01)
*G06F 3/044* (2006.01)
*H03K 17/975* (2006.01)
*H03K 17/96* (2006.01)

(52) U.S. Cl.
CPC .......... *G06F 3/0414* (2013.01); *G06F 1/1601* (2013.01); *G06F 3/044* (2013.01); *H03K 17/975* (2013.01); *H03K 17/962* (2013.01); *H03K 2217/960755* (2013.01)

(58) Field of Classification Search
CPC ...... G06F 3/0414; G06F 1/1601; G06F 3/044; H03K 17/975; H03K 2217/960755; H03K 17/962
See application file for complete search history.

(56) References Cited

U.S. PATENT DOCUMENTS

| | | | |
|---|---|---|---|
| 3,657,475 A | 4/1972 | Peronneau et al. | |
| 2003/0079549 A1 | 5/2003 | Lokhorst et al. | |
| 2007/0113681 A1 | 5/2007 | Nishimura et al. | |

*Primary Examiner* — Abhishek Sarma
(74) *Attorney, Agent, or Firm* — Baker & Hostetler LLP

(57) ABSTRACT

A method and a device for locating an interaction on a surface of large size to render it touch-sensitive are provided. The method is based on a modeling of the distributions of loads between capacitive sensors distributed over the surface and an estimation of the position closest to the interaction, by searching for a minimum cost associated with the proximity of the sensor measurements with established models.

17 Claims, 6 Drawing Sheets

METHOD AND DEVICE FOR LOCATING INTERACTION ON A TOUCH-SENSITIVE SURFACE

CROSS-REFERENCE TO RELATED APPLICATIONS

This application is a National Stage of International patent application PCT/EP2015/062763, filed on Jun. 9, 2015, which claims priority to foreign French patent application No. FR 1455302, filed on Jun. 11, 2014, the disclosures of which are incorporated by reference in their entirety.

FIELD OF THE INVENTION

The invention is in the field of touch-sensitive surfaces and relates more particularly to a method for locating an interaction on a touch-sensitive surface.

BACKGROUND

To render a surface of any nature touch-sensitive by making it possible to locate a press on a surface, the known solutions come mainly under two approaches, namely the deployment of a capacitive film or the laying of an infrared frame on the surface.

In the solutions based on the use of a capacitive film, a film composed of an electrical network etched on the latter and linked to electronics is deployed and glued on the surface to be touch-sensitized. When the surface is touched with a finger, the capacitance which is measured is modified, making it possible to locate the interaction. The drawback of this approach is that it is not compatible with an element other than the finger, making it difficult for example to wear gloves. Moreover, the deployment of such a film renders visible a network of wires printed on the latter, decreasing the transparency of the surface.

The solutions based on infrared (IR) technology use a frame composed of infrared light-emitting diodes (LEDs) laid on the surface and forming a gridwork of emitting and receiving rows. When a finger or any other object cuts off the horizontal and vertical beams, it is located. This technology is very sensitive to sunlight which is highly laden with infrared, as well as to the environment such as the degree of dirtiness of the surface. Moreover, the infrared frame is in general cup-like, this hampering the general design and the use of diverse surfaces.

An additional drawback which is common to the known approaches, is the cost of implementation which is very high and evolves exponentially as a function of the size of the surface to be touch-sensitized.

Moreover, other touch-sensitizing technologies exist based on the measurement of load with the help of strain gauges or pressure sensors. The interaction point is determined by considering the distribution of the loads and by associating it with the barycenter of the sensors weighted by the respective measured pressures. U.S. Pat. No. 3,657,475 proposes a device using three sensors to determine the point of pressure on a plate. However, these solutions are applicable only to small-size surfaces, that is to say those whose size does not exceed that of the conventional screens of personal computers or tablets.

Moving to more significant surfaces generates problems as regards the rigidity of the plate and the deformation of the surface under the application of an interaction force.

Moreover, an apparent lack of rigidity of a surface does not afford the user a good feeling during a touch.

To alleviate the problems related to the rigidity of the surface, it is possible to increase the number of sensors so as to improve its holding. However, the use of more than four sensors increases the degree of hyperstatism of the system and it is no longer possible to deduce an analytical equation by applying the principle of statics to determine the location of the touch.

Thus, no solution suitable for locating an interaction on a large-size surface exists in the prior art.

The present invention addresses this need by alleviating the drawbacks of the existing approaches.

SUMMARY OF THE INVENTION

An object of the present invention is to provide a device and a method making it possible to locate an interaction a surface of large size whose rigidity is not infinite.

Advantageously, the device of the invention enables a surface of large size to be touch-sensitized in a wholly transparent manner.

Another object of the present invention is to provide a method for touch-sensitizing a surface offering convenient implementation and reduced cost of implementation.

Another object of the present invention is to propose a modular touch-sensitizing device allowing easy addition or removal of sensors.

Another object of the invention is to propose a device which makes it possible to limit the deformation of the surface to be touch-sensitized by making it possible to fix it on an embeddable mount.

Advantageously, the invention proposes a method based on the measurement of force and the fusion of information arising from several sensors to locate an interaction on a surface to be touch-sensitized.

The present invention will advantageously apply in respect of interactive terminals of large size, items of furniture to be touch-sensitized, or else any application termed "simple touch" currently implemented with infrared and capacitive devices.

Aside from the low cost of the proposed device, a typical application may be the touch-sensitizing of a large-size ceiling light in the cabin of an automobile. The method and device of the present invention allows the total or partial illumination of the ceiling light via a localized touch-sensitive interaction. Advantageously, the proposed device does not impair the transparency of the ceiling light, and is particularly well suited for allowing light to pass through.

To obtain the results sought, a method for locating an interaction on a surface equipped with a plurality of sensors positioned according to axes (X, Y) at coordinates (Xi, Yj), each sensor being able to provide a value representative of the load measured during an interaction, is described. The method comprises the steps of:

(a) calculating for each coordinate Xi, a value representative of a load for an equivalent sensor, the value of each equivalent sensor corresponding to the sum of the values of the sensors positioned on the surface at said coordinate Xi;

(b) using the value of each equivalent sensor to model according to a cost criterion the distribution of the loads over a plurality of discrete positions 'Li' of the X axis, the plurality of discrete positions being predefined; and (c) determining the discrete position 'Li' having the minimum cost, representing the position closest to the interaction on the X axis.

In one embodiment, steps (a) and (b) are applied for each coordinate Yj of the Y axis and for a plurality of discrete positions 'Lj' and step (c) determines the discrete position 'Lj' closest to the interaction on the Y axis.

Advantageously, the method comprises after the calculation step (a), a step of normalizing the values of each equivalent sensor with respect to values of models of reference sensors.

In one embodiment, step (b) of modeling comprises the steps of:

calculating for each discrete position 'Li' an individual position cost of each equivalent sensor; and calculating for each discrete position 'Li', a general position cost of equivalent sensor as a function of the plurality of the individual position costs.

In a variant, the step of calculating individual cost consists in calculating the value squared of the discrepancy between the normalized value of the equivalent sensor and a normalized value that said equivalent sensor would measure at said discrete position 'Li'.

Advantageously, the method comprises a preliminary calibration step making it possible to define the normalized value.

In an advantageous embodiment, the method comprises after the determining step (c), a step of filtering the determined positions.

Advantageously, the filtering is performed with a low-pass filter. In one implementation, the frequency of the filter is defined according to adjustable thresholds.

The method of the invention can comprise a preliminary step of determining an interaction on the surface. The determining step can consist in measuring a weight exerted on the surface and in determining whether the measured weight is greater than a threshold value. Advantageously, a static bias value is deducted from the measurement of the exerted weight.

The invention also relates to a device for locating an interaction on a surface equipped with a plurality of sensors positioned according to axes (X, Y) at coordinates (Xi, Yj), each sensor being able to provide a value representative of the load measured during an interaction, the device comprising means for implementing the steps of the method.

Advantageously, the surface can be embedded in a fixed mount and the plurality of sensors can comprise sensors placed between the surface and the mount.

In one implementation variant, the plurality of sensors can comprise plane capacitive sensors positioned under the surface.

Alternatively, the plurality of sensors can comprise fork capacitive sensors, each fork capacitive sensor comprising two plane capacitive sensors assembled as a unitary capacitive device and positioned respectively facing on and under said surface.

The invention also relates to a computer program product comprising code instructions making it possible to perform all or part of the steps of the method.

Various aspects and advantages of the invention will be apparent in support of the description of a preferred but nonlimiting mode of implementation of the invention, with reference to the figures hereinbelow.

DETAILED DESCRIPTION OF THE INVENTION

Figure 1:
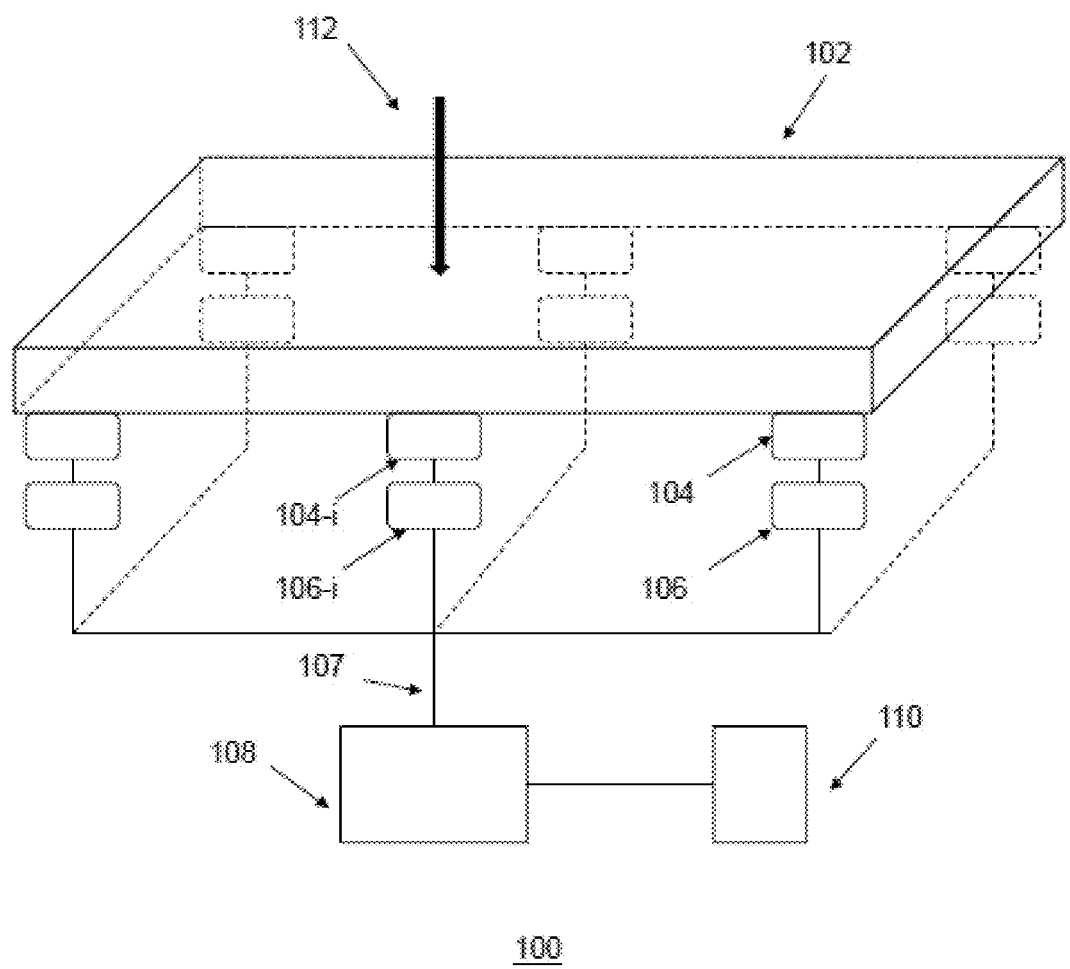
FIG. 1 illustrates a device for operating the method of the invention in one embodiment.

FIG. 1 illustrates a device 100 for operating the method of the invention in one embodiment. In the example of FIG. 1, a surface 102 is equipped with a plurality of sensors 104-$i$. For reasons of simplification of the description, FIG. 1 shows six sensors placed under a rectangular surface, but the person skilled in the art will be able to extend the principles of the invention to any other configuration of sensors and other shape of surface also relief (3D) surface. The surface can be a flexible polycarbonate plate or a transparent thermoplastic polymethyl methacrylate (PMMA) plate or be constituted of any wood, plastic or glass material.

In one embodiment, the surface can be embedded in a support, a chassis or a fixed mount not shown in FIG. 1, and the sensors placed between the surface and the chassis. In a preferential implementation, the sensors are a fork capacitive device such as described with reference to FIG. 2.

Advantageously, in order to reduce the risks of interference related to the external sources and allow the measurement of a very weak change of capacitance, each sensor 104 is coupled locally to a local-load measuring module 106 making it possible to measure the load passing through the sensor during an interaction 112 on the surface. In one implementation, the load measuring module contains means of analog-digital conversion that may have a system for regulating or filtering the power supply.

The output of each local-load measuring module 106 is dispatched to an interaction locating module 108 via a data transmission bus, of half-duplex bidirectional synchronous serial data bus type, such as the I2C normalized bus for example. In a preferential manner, the buses 107 ensuring the link between the locating module and each of the load measuring modules of each sensor are shielded wires.

Figure 4:
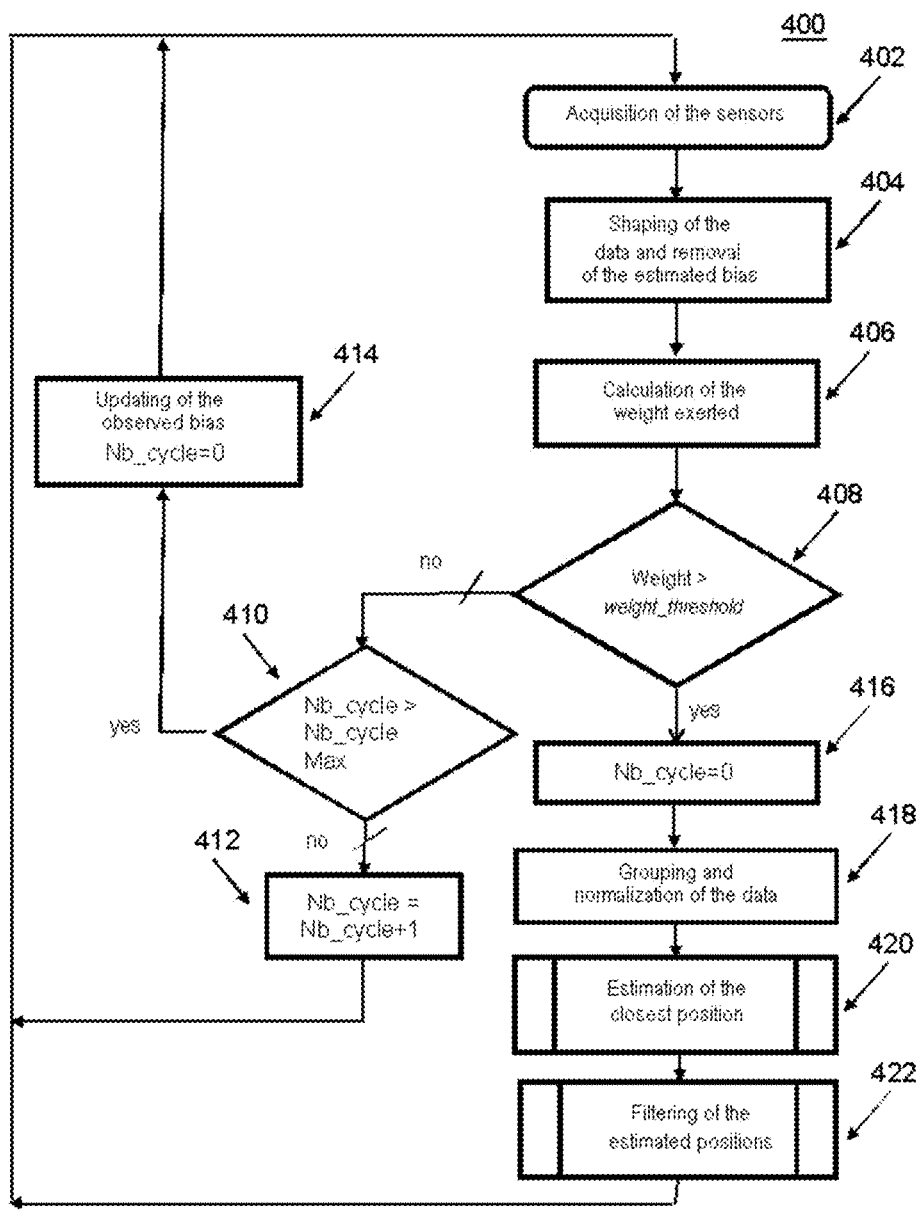
FIG. 4 shows a stringing together of the steps of the method for locating an interaction in one embodiment.
Figure 5:
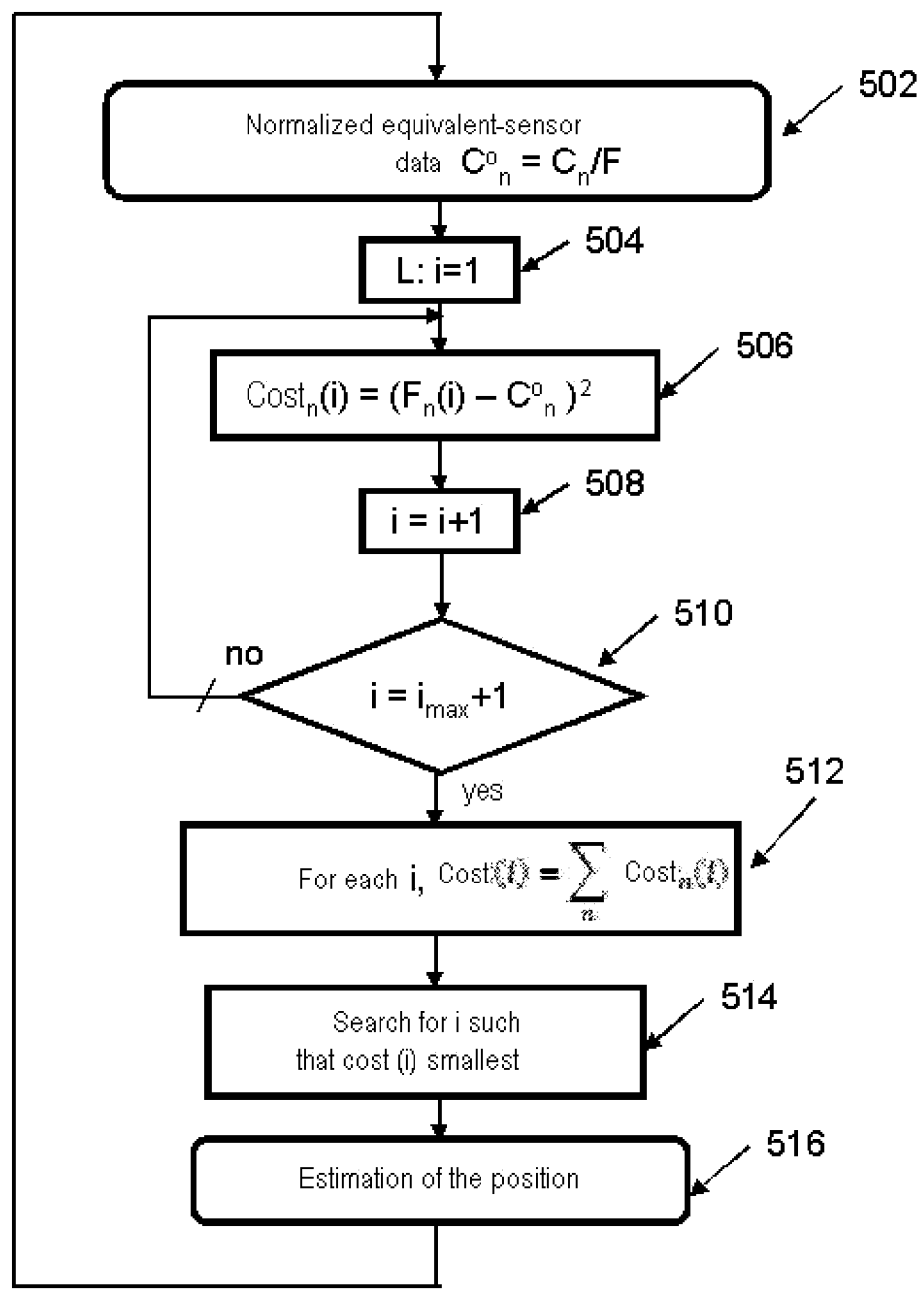
FIG. 5 details the steps of the calculation of the estimation of a position of a closest interaction in one embodiment.
Figure 6:
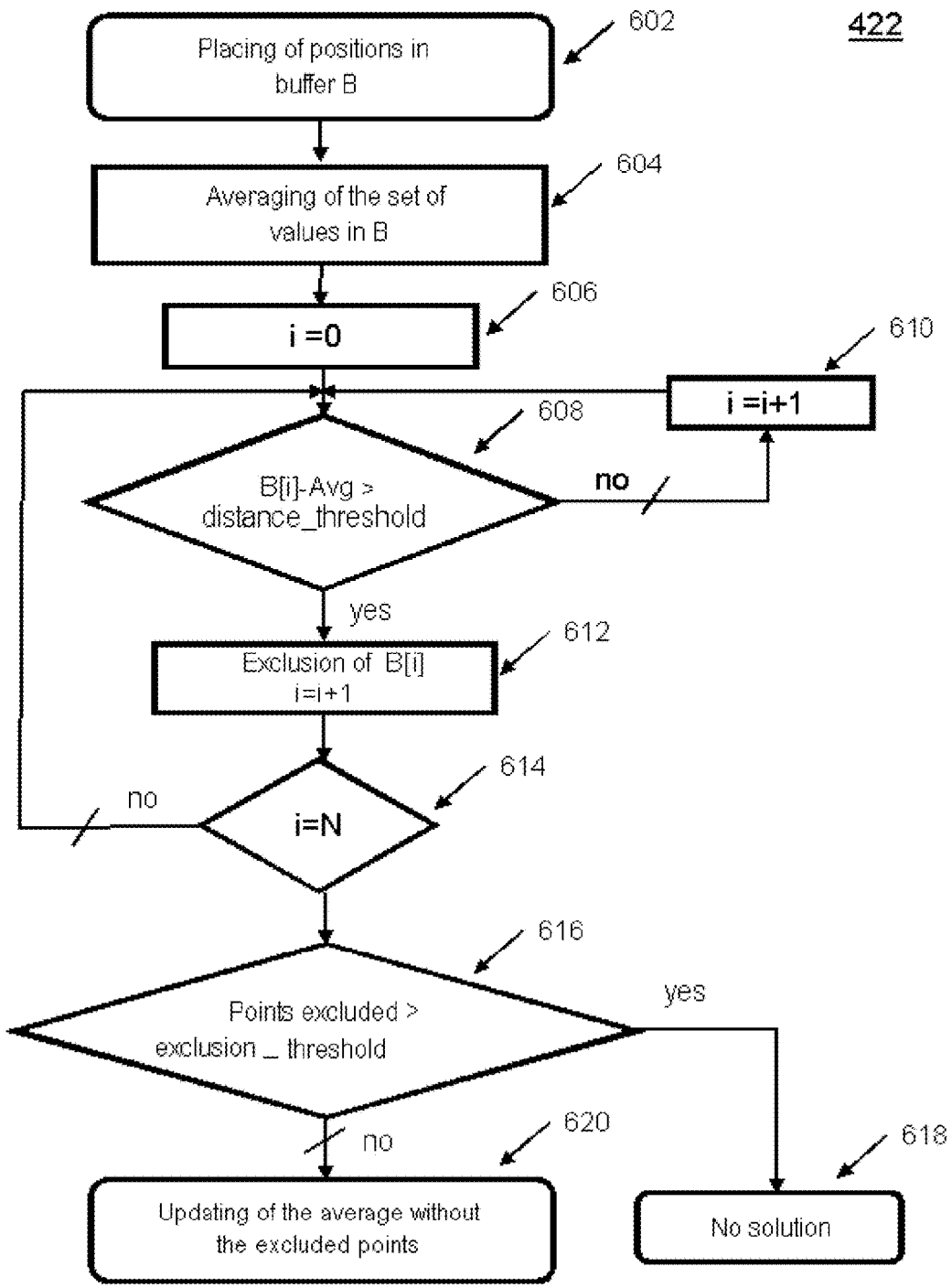
FIG. 6 details the steps of the filtering of the results of the estimating step of the method of FIG. 5.

The local-load measuring modules 106-$i$ are coupled to an interaction locating module 108 able to operate the locating method of the invention, such as described further on with reference to FIGS. 4 to 6.

Generally, the interaction locating module 108 comprises a multiplexer making it possible to receive the data arising from the plurality of load measuring modules 106-$i$, a processing unit of microcontroller type making it possible to execute the interaction locating method of the invention, and diverse components allowing the filtering and the power supply of the functions. Moreover, a connection technology comprising power supplies, I2C buses and I/Os makes it possible to connect an extension.

The microcontroller generally comprises at least one processor, random-access memory (RAM) and nonvolatile memory (FLASH) making it possible to store and execute the interaction locating method of the invention.

In one implementation variant, a second interaction locating module can operate in 'slave' mode with a first master module making it possible to distribute the acquisition of the data of the sensors over the two modules. In this variant, a link of I2C type establishes communications between the two modules.

Advantageously, the modular electronic arrangement combining the local-load measuring modules 106-i and the interaction locating module 108 allows easy addition or removal of sensors 104-i so as to adapt to any surface shape and any type of application.

The interaction locating module 108 can be coupled to various peripherals 110 making it possible to interpret a result produced to trigger an action related to the detection of the interaction. Thus, the module can for example be linked to a computer via a USB output. In the context of the invention, an action can be a response according to the position of an interaction, such as for example, the illumination of an LED or a strip of LEDs of a car ceiling light as a function of the side on which a user has pressed.

Figure 2:
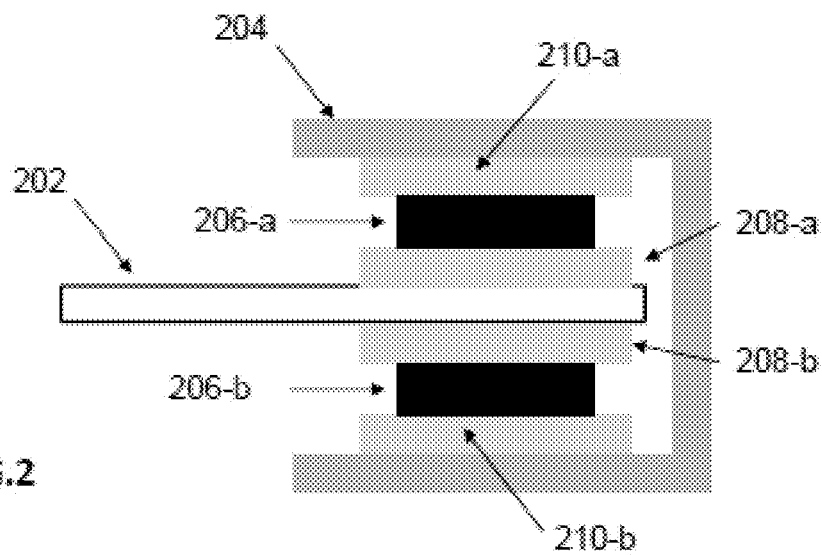
FIG. 2 shows an exemplary capacitive sensor suitable for operating the method of the invention.

FIG. 2 illustrates an exemplary fork sensor in a preferential implementation of the invention. The fork sensor consists of two capacitive sensors assembled as a unitary capacitive device, comprising a central armature (208-a, 208-b) fastened to the one surface to be touch-sensitized 202 and earthed, two external armatures (210-a, 210-b) linked respectively to an input of the local-load measuring module 106, the external armatures being respectively separated from the central armature by a dielectric material (206-a, 206-b).

Thus, the capacitive sensors are situated respectively on either side of a plate 202 exhibiting an upper face and a lower face. In the context of the invention, the sensor situated above the plate is termed the 'upper sensor' and the sensor situated below the plate is termed the 'lower sensor'. The sensors are disposed on the edges of the plate and embedded in a mount or chassis 204. Each sensor comprises two electrodes separated by a dielectric (206-a, 206-b).

The upper sensor comprises a first electrode 208-a fastened to the plate and a second electrode 210-a fastened to the chassis. A dielectric 206-a consisting of an elastic and insulating substance, such as for example silicone or polyurethane, is situated between the two electrodes. The dielectric makes it possible to increase the measured capacitance by increasing the permittivity of the medium. Moreover, it constitutes a restoring function which, when a force related to an interaction is applied to the surface, compresses so as to bring the two electrodes closer together, and which, when the force disappears, relaxes so as to reset the electrodes in their initial rest position.

In a similar manner, the lower sensor comprises a first electrode 208-b fastened to the plate and a second electrode 210-b fastened to the chassis, which are separated by a dielectric 206-b.

Each electrode fastened to the plate is movable under the effect of a pressure on the plate and of the deformation of the dielectric. Each electrode fastened to the mount is fixed and constitutes a signal electrode linked respectively to an input of the local-load measuring module 106.

In a preferential implementation, the signal electrode (210-a, 210-b) consists of a cylindrical shaped plate covered with copper on each of its faces. A first face is linked to a conversion component of the local-load measuring module 106. The conversion component makes it possible to digitally convert the capacitance measured across the terminals of the sensor. The second face of the signal electrode is linked to a shielding to avoid possible interference. In those cases where the chassis is metallic, a hollowed out second rectangular shaped plate makes it possible to insulate the shielding of the metallic chassis so as to avoid short-circuits and pass the shielded wire linking the set of local-load measuring modules through to the locating module 108.

Other methods for measuring the capacitance allowing a measurement between two different signals of the earth can be applied.

In a preferential implementation, the movable electrode consists of an earthed epoxy plate glued to the surface 202 by an adhesive film which can be of the order of 0.1 mm thick. For surfaces of large size, the rigidity of the plate is significant and can bring about an angle of deviation of the earth electrode which spoils the measurement. Optionally, a very flexible layer such as foam can be inserted between the surface 202 and the central armature (208-a, 208-b) to compensate the angle of deviation when the plate deforms.

In a particular implementation, the surface is a glass pane 90 cm long, 3 mm thick, equipped with six fork sensors whose electrodes have an area of about 1 cm². The signal electrode has a thickness of 1.6 mm, the earth electrode has a thickness of 0.4 mm, and the dielectric inserted between the two electrodes is a polyethylene foam 0.8 mm thick.

Taken in isolation, each sensor is a plane capacitive sensor whose measured capacitance is that of a plane capacitor which is expressed according to the following equation (1):

$$C = \varepsilon_a \frac{A}{d} \tag{1}$$

where $\delta_a$ represents the permittivity of the dielectric, A the surface area of the electrodes and d the distance between the two electrodes. Denoting by $C_0$ the measured initial capacitance and by $d=d_0$ the distance between the two electrodes when no force is applied to the surface, and by defining $\Delta C = C - C_0$, it is then shown that:

$$\frac{\Delta C}{C_0} = \frac{d_0 - d}{d} \tag{2}$$

and by putting $d = x \cdot d_0$ such that $0 < x \leq 1$, the following equation is obtained:

$$\frac{\Delta C}{C_0} = \frac{1-x}{x} \tag{3}$$

On the basis of this relation, an evolution curve for the relative discrepancy of a plane capacitance as a function of the percentage of squashing of the dielectric shows that to have a $C_0$ large enough to be measured correctly by measurement means for example of the order of 10 pF, and to have the largest possible variation for a small displacement of the movable electrode, the distance $d_0$ must be a minimum.

It is also shown that in order to have a sufficiently large force or pressure for a given load, the surface area of the electrodes A must be limited. Moreover, the deformation of the dielectric being dependent on the material chosen, it is appropriate to take account thereof in the actual "applied load/measured capacitance" relation.

Thus advantageously, the fork sensor makes it possible to aggregate the effect of a plane capacitor operating in compression, when a force is applied to the surface and when the lower sensor is squashed, and of a second plane capacitor operating in traction when a force is applied to the surface and the upper sensor expands.

Advantageously, the assembled fork sensor is of better quality than two sensors taken in isolation through an increase in the dynamic swing of the measurement, better filtering of the disturbances, and a better compromise on the precision of the measurement. The fusion of the lower and upper sensors is carried out at the level of the local-load measuring module 106 linking the upper capacitance on the positive terminal and the lower capacitance on the negative terminal and by calculating the sum of the capacitances measured on each sensor.

On account of its configuration, advantageously the fork sensor allows a surface which is to be touch-sensitized to be embedded in a mount and held without it being necessary to add complementary fixing means. The patent application from the same applicant entitled "Dispositif de maintien de surface tactile" [Touch-sensitive surface holding device] filed on the same day describes such a holding device based on a fork sensor.

If the rigidity of the glass pane is insufficient, the interaction locating method of the invention can be operated for a capacitive device comprising just a single lower sensor working in compression.

Figure 3:
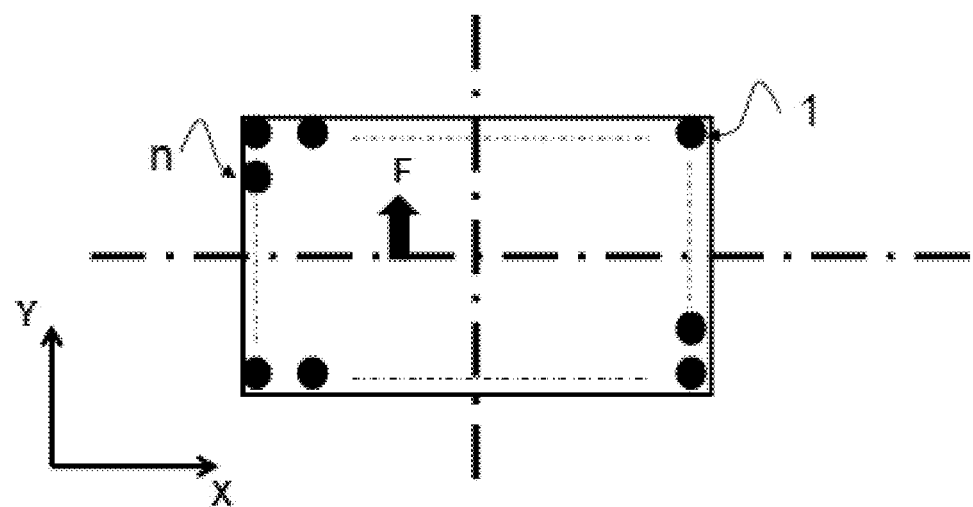
FIG. 3 illustrates the relation between an interaction point on a surface and the position of sensors.

FIG. 3 illustrates the relation between an interaction point on a surface and the position of sensors for a surface of large size equipped with N sensors. The sensors are disposed respectively at a site Pos(n) of the plate, where n represents the index number of a sensor lying between 1 and N. The sensors are positioned with respect to main axes (X, Y).

In order to locate the interaction taking place on the surface, in the prior art, it is customary to liken the position Pos(F) of the interaction to the barycenter of the position, weighted by the force $C_n$ measured by each of the sensors, of all the sensors according to the following equation:

$$\Sigma_n C_n \cdot Pos(n) = F \cdot Pos(F) \quad (4)$$

The position Pos(n) of the sensors being known and $F = \Sigma_n C_n$, it is possible to deduce the position of the force F applied:

$$Pos(F) = \sum_n \frac{C_n}{F} \cdot Pos(n) \quad (5)$$

In theory, such a relation is correct, but it does not, however, take into account the diverse imperfections related to cheap sensors on the one hand, such as the lack of precision or the disparity between the sensors, and related to the surface itself such as the limited rigidity of the surface. Thus, in practice it is found that the precision is insufficient and that it fluctuates as a function of the position of the interaction on the surface. The method of the invention makes it possible to circumvent these drawbacks. Accordingly, the general principle of the method 400 for locating an interaction, such as described with reference to FIG. 4, is based on modeling the distributions of loads of the sensors and on minimizing a cost associated with the proximity of the measurements of the sensors to reference models which are established by displacing a gauge mass to known positions of the surface.

As explained previously, the use of capacitive sensors makes it possible to measure the displacement of an electrode subjected to a restoring force, and then from the knowledge of this displacement, an image of the force applied to the electrode is deduced. However, the value to be measured being the pure interaction force between the user and the surface, it is important to compensate for a static bias, present on the sensors, arising from the weight of the plate inter alia. The static bias is measured on initializing the system at t=0, where the system is left free, untouched by the user. A capture of the data arising from the fork sensors is performed and provided the static bias.

Advantageously, an averaging over several values for a few hundreds of milliseconds makes it possible to improve the measurement. Hereinafter in the method, the static bias calculated is systematically deducted from the measurements performed during the interactions.

Moreover, the value returned by a sensor may be impaired by the environment, such as temperature, humidity for example, and this drift constitutes a time-varying dynamic bias. Therefore, the drift caused by dynamic bias(es) is evaluated to make it possible to compensate for it. In order to evaluate the dynamic bias, the assumption is made that the dynamic swing of the disturbance is slow compared with the system sampling frequency and compared with the dynamics of interaction with the user, causing the system to drift very slowly.

After the initialization phase, the method operated by the locating module 108 begins during an interaction, with a step 402 of acquiring the values dispatched by the local-load measuring modules 106-i of each fork sensor.

In a next step 404, the data received are shaped to determine a current value of the weight exerted, the static bias is removed, and the weight exerted on the surface is calculated (step 406).

In the next step 408, the calculated weight (deducted from the static bias) is compared with a threshold value 'Weight-_threshold'. In a preferential manner, the threshold value is fixed and defined during design so as to achieve a compromise between the sensitivity of the interaction desired and the electrical and mechanical disturbances of the system.

If the calculated weight is greater than the threshold value, the method continues to step 416 by considering that an interaction is in the process of occurring and that the deviation of the sensors is due to it.

If the measured weight is less than the threshold value, the method continues via steps 410, 412, 414 by considering that there is no interaction with a user, that the surface is assumed free, i.e. untouched, and that the residual deviations are due to drifts akin to dynamic bias.

In order to allow the signal to rise during the transition phases of the interaction, the criterion for comparing the measured weight with the threshold value must be repeated over n cycles (410, 412) before updating the bias (414). The number of n cycles required fixes the disturbance dynamics.

Returning to step 416, signifying that an interaction is detected, the locating method continues generally with steps 418, 420, 422 consisting of a grouping and a normalization of the grouped data (418), an estimation of the closest position (420) and a filtering of the estimated positions (422).

Figure 7:
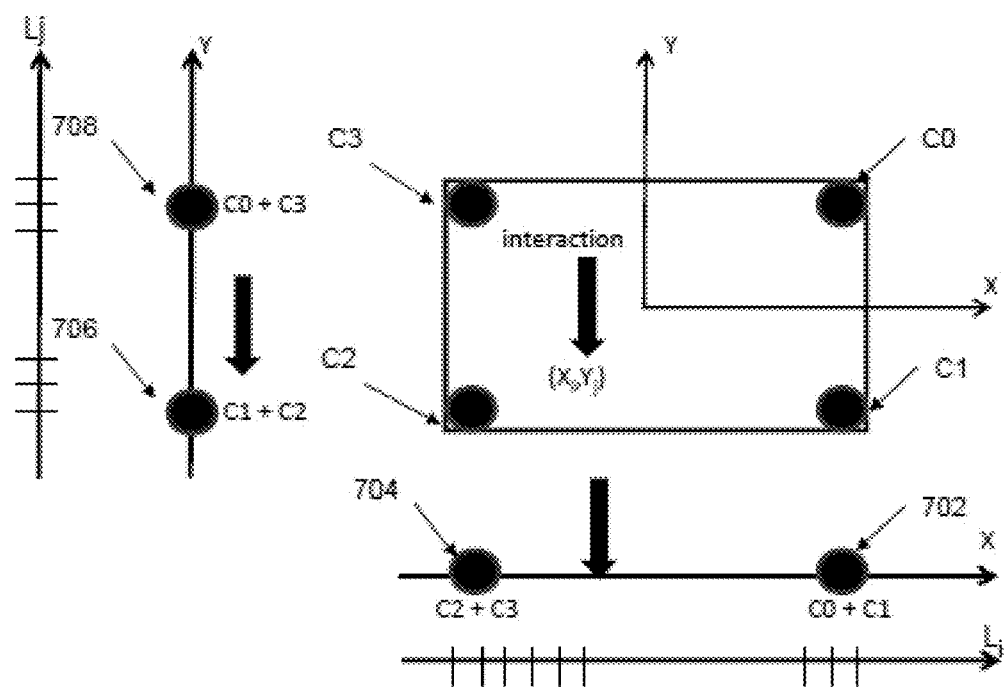
FIG. 7 illustrates a projection of sensors as equivalent sensors.

The grouping step 418 consists in decoupling the X and Y axes of the surface, and then in projecting onto each of the axes the loads measured by the plurality of sensors disposed on same coordinates on the perpendicular axis so as to deduce there-from sensors called "equivalent sensors". FIG. 7 illustrates the projection of four sensors (C0 to C3) disposed on a surface as an "equivalent sensor $C^{0}$". Thus the example of the sensors of FIG. 7 produces four equivalent sensors. The value for an equivalent sensor is the sum of the values of the projected sensors. Thus, the value for a first equivalent sensor (702) on the X axis which is the projection of the sensors C0 and C1 is the sum of the values measured on the real sensors 'C0+C1' situated at the same coordinates.

A second equivalent sensor (704) on the X axis corresponds to the projection of the sensors C2 and C3 and its value is the sum 'C2+C3'. The projection on the Y axis of the sensors C1 and C2 produces an equivalent sensor (706) having a value equal to the sum 'C1+C2' of the values measured on the sensors C1 and C2. The projection on the Y axis of the sensors C0 and C3 produces an equivalent sensor (708) having a value equal to the sum 'C0+C3' of the values measured on the sensors C0 and C3.

The example illustrated is in no way limiting and the person skilled in the art will extend the principle described whatever the number and the positions of the sensors.

The value of each equivalent sensor is thereafter normalized "$C^0_n$," so as to circumvent the contact force engendered by the interaction as well as its position on the surface. This normalization $C^0_n$ is represented in equation (5) given above as being the term $$\frac{C_n}{F} \text{ where } F = \sum C_n.$$

After step 418 of grouping and normalizing the sensors, the method continues to step 420 with a calculation of an estimation of the closest position for the interaction.

FIG. 5 details this step of the method in one embodiment. After the step of recovering the normalized data (502), the method consists in discretizing (504) a first axis X into a set of 'L' possible positions, L being a number defined according to the desired precision. In practice, a set of L=100 possible positions makes it possible to achieve a precision of the order of a centimeter for a surface one meter long.

The method thereafter enters a calculation loop (506, 508, 510) for the set of defined positions. The method makes it possible to calculate, for each of the discrete positions denoted '$L_i$' and for each equivalent sensor 'n', the discrepancy between the normalized value of the equivalent sensor '$C^0_n$' and a normalized value '$F_n(i)$' that this equivalent sensor would measure if it were situated at the position studied '$L_i$'. This discrepancy is squared to obtain a position cost denoted:

$$\text{Cost}_n(i) = (F_n(i) - C^0_n)^2 \quad (6)$$

associated with the position '$L_i$'.

The normalized value '$F_n(i)$' is defined earlier during a step of calibrating the surface.

The method increments the positions (508, 510) to calculate an individual position cost associated with the eligibility of a position 'i' for each equivalent sensor.

When all the positions have been taken into account (Yes branch of 510), the method continues to step 512, where a general position cost is calculated for each position '$L_i$', by summing the individual cost seen by each of the equivalent sensors, such that:

$$\text{Cost}(i) = \Sigma_n \text{Cost}_n(i) \quad (7)$$

Next in the next step 514, the method makes it possible to determine the discrete position '$L_i$' on the axis considered which minimizes the general position cost. Next the method generates in step 516, the selected position, corresponding to the best estimation of the position of the interaction on the axis considered.

The method of step 420 may be repeated for the second axis Y, for the coordinates $Y_j$ and for discrete positions $L_j$.

Alternatively, the method described may be applied only for the X axis and combined with a known barycenter calculation technique for the second axis Y.

Advantageously, the locating method of the invention is robust since it takes into account the set of disparities of the system through an initial calibration step which is carried out during commissioning, and which can also in a simple manner be reinitialized should the system be modified.

Thus, step 420 produces the coordinates $X_i$ and $Y_j$ of the estimated position closest to the interaction.

The position of the estimated interaction as output from step 420 might not be used directly since it may be noisy and sometimes erroneous notably during the dynamic phases of the touch, or through the lack of reliability notably regarding the dynamic swing of the sensors used. In an optional manner, a filtering step 422, such as described with reference to FIG. 6, can be added to the method. A filtering of the measurements via a low-pass filter is applied making it possible to eliminate aberrant positions. Adjustable thresholds make it possible to define the cutoff frequency of the filter as well as to harden or to soften the criterion for rejecting points. These thresholds are adjusted as a function of two main criteria, the desired precision and the refresh frequency.

In a first step 602, the estimated positions are placed in a rotating buffer 'B' of size 'BuffSize', defined during design, and an average value 'Avg' is calculated (step 604) for the set of recorded values.

Thereafter, the method makes it possible (608) to calculate the distances between the data placed in the buffer and the average 'B[i]-Avg', and to compare the discrepancy with a given fixed threshold 'Distance_threshold', effecting a compromise between the precision sought and the reactivity of the system.

If the discrepancy is less than the threshold, the method makes it possible to retain the value and passes to the next value (610).

If the discrepancy is greater than the threshold, the value concerned is excluded from the buffer in step 612, and the method processes a next value (614).

When all the values of the buffer have been processed, the method makes it possible in the next step (616) to determine whether the number of non-excluded values remaining in the buffer is sufficient and compares it with a fixed exclusion threshold 'Exclusion_threshold', effecting a compromise between the precision sought and the reactivity of the system.

If the number is insufficient (618) because too many values have been excluded, sufficient precision is not achieved to produce a result and it will be necessary to wait for the next cycle to have a possible output.

If the number is sufficient (620), the average of the set of values is updated, taking into account only the valid points so as to constitute the filtered output of the system.

It is then noted that the larger the size of the buffer 'B' the more significant the smoothing of the data. In the same manner, the smaller the distance threshold 'Distance_threshold', the less permissive is the algorithm regarding the scatter in the estimated position. Finally, the exclusion threshold 'Exclusion_threshold' serves mainly to always guarantee a minimum passband of the low-pass filter, stated otherwise a sufficient number of points in the calculation of the average.

Thus the present description illustrates a preferential implementation of the invention, but is not limiting. It may be implemented with the help of hardware and/or software elements. An example has been chosen to allow a good understanding of the principles of the invention, but it is in no way exhaustive and must enable the person skilled in the art to make modifications and variants of implementation while retaining the same principles.

The invention claimed is:

1. A method for locating an interaction on a surface equipped with a plurality of sensors positioned according to axes (X, Y) at coordinates ($X_i$, $Y_j$), each sensor being able to provide a value representative of the load measured during an interaction, the method comprising the steps of:
   (a) calculating for each coordinate $X_i$, a value representative of a load for an equivalent sensor, said value of each equivalent sensor corresponding to the sum of the values of the sensors positioned on the surface at said coordinate $X_i$;
   (b) using the value of each equivalent sensor to model the distribution of the loads over a plurality of predefined discrete positions '$L_i$' of the X axis, the modeling being done according to a cost criterion associated with the proximity of the measurements of the sensors with established reference models by displacing a gauge mass to known positions of the surface; and
   (c) determining the discrete position '$L_i$' having the minimum cost, representing the position closest to the interaction on the X axis.

2. The method as claimed in claim 1 wherein steps (a) and (b) are also applied for each coordinate $Y_j$ of the Y axis and for a plurality of discrete positions '$L_j$' and wherein step (c) determines the discrete position '$L_j$' closest to the interaction on the Y axis.

3. The method as claimed in claim 1 comprising after the calculation step (a), a step of normalizing the values of each equivalent sensor with respect to values of models of reference sensors.

4. The method as claimed in claim 1 wherein step (b) of modeling comprises the steps of:
   calculating for each discrete position '$L_i$' an individual position cost of each equivalent sensor; and
   calculating for each discrete position '$L_i$', a general position cost of equivalent sensor as a function of the plurality of the individual position costs.

5. The method as claimed in claim 4 wherein the step of calculating individual cost consists in calculating the value squared of the discrepancy between the normalized value of the equivalent sensor and a normalized value that said equivalent sensor would measure at said discrete position '$L_i$'.

6. The method as claimed in claim 5 comprising a preliminary calibration step making it possible to define the normalized value.

7. The method as claimed in claim 1 moreover comprising after step (c) a step of filtering the determined positions.

8. The method as claimed in claim 7 wherein the filtering is performed with a low-pass filter.

9. The method as claimed in claim 8 wherein the frequency of the filter is defined according to adjustable thresholds.

10. The method as claimed in claim 1 further comprising before step (a), a step of determining an interaction on the surface.

11. The method as claimed in claim 10 wherein the step of determining an interaction consists in measuring a weight exerted on the surface and in determining whether the measured weight is greater than a threshold value.

12. The method as claimed in claim 11 wherein a static bias value is deducted from the measurement of the exerted weight.

13. A computer program product, said computer program comprising code instructions making it possible to perform all or part of the steps of the method as claimed in claim 1, when said program is executed on a computer.

14. A device for locating an interaction on a surface equipped with a plurality of sensors positioned according to axes (X, Y) at coordinates ($X_i$, $Y_j$), each sensor being able to provide a value representative of the load measured during an interaction, the device comprising means for implementing the steps of the method as claimed in claim 1.

15. The device as claimed in claim 14 wherein the surface is embedded in a fixed mount and the plurality of sensors comprises sensors placed between the surface and the mount.

16. The device as claimed in claim 14 wherein the plurality of sensors comprises plane capacitive sensors positioned under said surface.

17. The device as claimed in claim 14 wherein the plurality of sensors comprises fork capacitive sensors, each fork capacitive sensor comprising two plane capacitive sensors assembled as a unitary capacitive device and positioned respectively facing on and under said surface.

* * * * *